United States Patent [19]

Monford, Jr.

[11] 3,958,238

[45] May 18, 1976

[54] BINARY CONCATENATED CODING SYSTEM

[75] Inventor: Leo G. Monford, Jr., Texas City, Tex.

[73] Assignee: The United States of America as represented by the United States National Aeronautics and Space Administration, Washington, D.C.

[22] Filed: Dec. 14, 1972

[21] Appl. No.: 315,070

[52] U.S. Cl......................... 340/347 P; 340/347 DD

[51] Int. Cl.² .......................................... H03K 73/00

[58] Field of Search.................. 340/347 P, 347 DD; 235/154, 61.6 A, 61.6 B

[56] References Cited

UNITED STATES PATENTS 3,467,957 9/1969 Levine ................................ 340/347

*Primary Examiner*—Charles D. Miller

*Attorney, Agent, or Firm*—Carl O. McClenny; John R. Manning; Marvin F. Matthews

[57] ABSTRACT

A system of measuring, counting, and recording numerical information using binary notation with a minimized number of digits or bits, a system that may frequently be used to better advantage than the well known binary pulse code modulation system or the delta modulation system. In the binary concatenated coding system (hereinafter BCC), a three-bit data word is used to count all whole numbers from zero through 99, whereas for the same count capability and resolution the binary system requires the use of seven bits. In any one of the 10 decades this is accomplished by starting with a one, progressing stepwise from one to seven and then to zero in a binary fashion, thus providing eight positions corresponding to the first eight numbers of our everyday Arabic system. The ninth and tenth positions are oocupied by two of these same eight numbers so selected and arranged that they uniquely describe the decade completed by them relative to the other nine decades of the total count capability of 100.

2 Claims, 4 Drawing Figures

| POSITION ↓ | BINARY WORD A=1 | B=2 | C=4 | DECIMAL EQUIVALENT A+B+C |
|---|---|---|---|---|
| 0 | 0 | 0 | 0 | 0 |
| 1 | 1 | 0 | 0 | 1 |
| 2 | 0 | 1 | 0 | 2 |
| 3 | 1 | 1 | 0 | 3 |
| 4 | 0 | 0 | 1 | 4 |
| 5 | 1 | 0 | 1 | 5 |
| 6 | 0 | 1 | 1 | 6 |
| 7 | 1 | 1 | 1 | 7 |
| 8 | 0 | 0 | 0 | 0 |

| POSITION → / ↓DEC. GROUP | 1 | 2 | 3 | 4 | 5 | 6 | 7 | 8 | 9 | 10 | DECADE: ↓3(9'S)+(10'S)−10 |
|---|---|---|---|---|---|---|---|---|---|---|---|
| 1-10 | 1 | 2 | 3 | 4 | 5 | 6 | 7 | 0 | 2 | 4 | 0 |
| 11-20 | 1 | 2 | 3 | 4 | 5 | 6 | 7 | 0 | 2 | 5 | 1 |
| 21-30 | 1 | 2 | 3 | 4 | 5 | 6 | 7 | 0 | 2 | 6 | 2 |
| 31-40 | 1 | 2 | 3 | 4 | 5 | 6 | 7 | 0 | 2 | 7 | 3 |
| 41-50 | 1 | 2 | 3 | 4 | 5 | 6 | 7 | 0 | 3 | 5 | 4 |
| 51-60 | 1 | 2 | 3 | 4 | 5 | 6 | 7 | 0 | 3 | 6 | 5 |
| 61-70 | 1 | 2 | 3 | 4 | 5 | 6 | 7 | 0 | 3 | 7 | 6 |
| 71-80 | 1 | 2 | 3 | 4 | 5 | 6 | 7 | 0 | 4 | 5 | 7 |
| 81-90 | 1 | 2 | 3 | 4 | 5 | 6 | 7 | 0 | 4 | 6 | 8 |
| 91-100 | 1 | 2 | 3 | 4 | 5 | 6 | 7 | 0 | 4 | 7 | 9 |

BINARY WORDS, DECIMAL EQUIVALENT (columns 1–10)

BINARY CONCATENATED CODING SYSTEM

ORIGIN OF THE INVENTION

The invention described herein was made by an employee of the U.S. Government, and may be used by or for the Government of the United States of America for governmental purposes without the payment of any royalties thereon or therefor.

BACKGROUND OF THE INVENTION

1. Field of the Invention

This invention relates to binary measuring, counting, and recording systems, and more particularly to such systems using binary notation to express numerical data with a small number of bits for each piece of numerical information involved.

2. Description of the Prior Art

Of the many codes that exist in today's digital electronic world, only two major techniques are generally accepted. These are pulse code modulation and delta modulation. PCM systems output a digital data word for each measurement increment which entirely defines the position of that increment. Measurement granularity is determined by the number of digital bits or length of data word allocated for a given data or voltage excursion. Delta modulated systems utilize only one bit and provide only incremental changes. There are many situations where this type data coding is very useful and practical. These are the only two "pure" fundamental approaches to digital coding; however, a large percentage of applications exist where neither of these provide an acceptable solution.

One classic, nonelectronic example of this shortcoming is the standard carpenter's ruler. The smallest increment or graduation on the ruler is one-sixteenth of an inch denoted by evenly spaced lines. On most, different lengths of lines denote various fractions of inches. The inch marks are numbered corresponding to relative position as are the foot or 12 inch increments. Most persons find no difficulty in making measurements with this type system of measure; not so electronically. If this ruler were graduated in delta modulation, which might be the only feasible marking system if, for instance, the ruler had the width of a pencil, none of the graduations would be numbered and all lines would be the same length. In order to make a measurement each line would have to be counted from one end or the other to the measured point. With PCM, each graduation would have to be numbered in 16ths. Clearly, this is not possible for reasons of utility on most rulers. In other words, the ruler uses a code of its own in order to accomplish its goal which it would not do through the use of PCM or delta modulation, and the simplicity of the code and its obvious utility are attested to by the longevity of this method.

SUMMARY OF THE INVENTION

In the familiar binary system, which is used so that numerical data can be stored in, utilized by, and retrieved from a machine, only two conditions exist. These conditions are an "on" position and an "off" position, for instance, of an electrical switch, memory storage unit or the like; when the same quantitative information is expressed numerically, only the digits "0" and "1" are employed. This makes it awkward to lay out a scale of binary numbers expressing, for example, all of the whole numbers from 1 to 100 of the decimal system. Starting with the decimal-to-binary equivalents of 1 equals "01," 2 equals "10," 3 equals "11," 4 equals "100," 5 equals "101," etc., we find that "15" must be expressed as "1111," 27 must be expressed as "11011," 42 has the binary equivalent of "101010," and ultimately, "100" is expressed in binary language as "1100100." Despite the advantages of the binary system, it will be apparent that a very high number in the decimal system requires a much longer number in the binary system, i.e., one having a very large number of digits. To make matters worse, the binary system will not permit any zeros to be implied. This means that if the machine we are using is programmed to deal with all decimal whole numbers from 1 to 100, we cannot express the smaller numbers with only the small number of digits indicated, but must use all seven digits, e.g., 1 is expressed as "0000001," 2 as "0000010," etc.

It is the principal object of the present invention to avoid the shortcomings and disadvantages of prior art numerical coding systems, including those discussed above. More specifically, it is an object of the present invention to provide a binary coded measurement, counting, and recording system in which the number of bits required to express a measurement are minimized, but without requiring the counting from zero to a particular point of measurement in each instance, as in the delta modulation system. This BCC or binary concatenated coding system may be used to express a physical quantity electronically in any combination of measuring the quantity, recording it permanently or temporarily, and reading or counting it, and further objects of the invention are to provide structures and methods for utilizing the system.

The present invention proceeds on the assumption that it is not essential to most measuring and coding systems that each number be uniquely different from every other number in the system, and that its true value can be determined by reference to data close to its position within the total system or scale. Using a meter stick analogy, for instance, one will recall that in the typical such measuring stick only the decimeters are marked with numerals, as 10, 20, 30, etc. (to indicate the 10th, 20th, 30th, etc., centimeter) while between decimeters there are simply lines and numbers to indicate the centimeters and smaller unnumbered lines to indicate millimeters, sometimes with a larger line for the 5th millimeter. The centimeter lines between decimeter markings are typically marked with numerals 1 through 9, repeated identically for each decade. To determine the complete distance of a particular marking from a reference point such as the zero of the meter stick, the user refers to the nearest decimeter marking, usually the lower rather than the higher, and adds to this reading the number of gradations to the point in question, e.g., if he is between 70 and 80 and his particular mark falls at centimeter 6 he will add 6 to 70 to arrive at a total measurement of 76 centimeters.

A modification of this system is used in the measurement system of the present invention, the binary concatenated coding system. In this system of the present invention, the first 7 numbers of any decimal decade are coded in binary fashion, so that 1 equals "001," 2 equals "010," and 7 is represented by "111." Thereafter, rather than jumping to "1000" to represent 8, all decimal system numbers ending in 8 are expressed as "000." For the decimal numbers ending in digits 9 and 0, two of the same seven data words corresponding to the decimal numbers from 1 to 7 are repeated, but in each instance the two digits selected must serve a double purpose: (1) each data word or combination of three bits must represent either a 9 or a 0, and (2) the combination of the two data words must uniquely describe the decade in which the group of 10 equivalent decimal numbers lie. While there apparently are a great many possibilities for the combination of data words representing the 9's and 10's, 7 by 10 or 70 in all, it is desirable to eliminate some combinations (actually permutations) of seven things taken two at a time. Thus all of the two-word possibilities starting with a zero are eliminated, so that there will be some change indicated in going from the 8's position (coded as zero) to the 9's position, as for instance if the values of these successive positions are being read on an ammeter. For the same reason, 1 is not used in 10's position and all duplicates in the 9's and 10's positions are avoided, as in either instance the meter would not indicate a change, falsely. All two-word permutations starting with a 1 in the 9's position are avoided in order that the user scanning on both sides of the 10's position will not be confused as to whether he is looking at an increment or a decrement, and for a like reason a 2 is not used in the 10's position nor a 7 in the 9's position. Even after eliminating such possibilities, however, there are sufficient remaining permutations to do some arbitrary choosing, and one such choice of the present invention provides a convenient memory aid: three times the value of the 9's position plus the value of the 10's position minus 10 equals the decade. This will be further discussed below, in connection with the drawing figures.

While the bulk of the present specification is limited to a description of a three bit system having a count capability of 100 and a resolution of one, it will be readily apparent that combinations of the system will enable even greater resolution. Two of the three bit systems of the present invention combined will yield a count capability of 10,000 for the combination making a six bit data word, while three of them combined will yield a capability of 1 million for a nine bit data word, etc.

DETAILED DESCRIPTION OF THE DRAWING FIGURES

Figure 1:
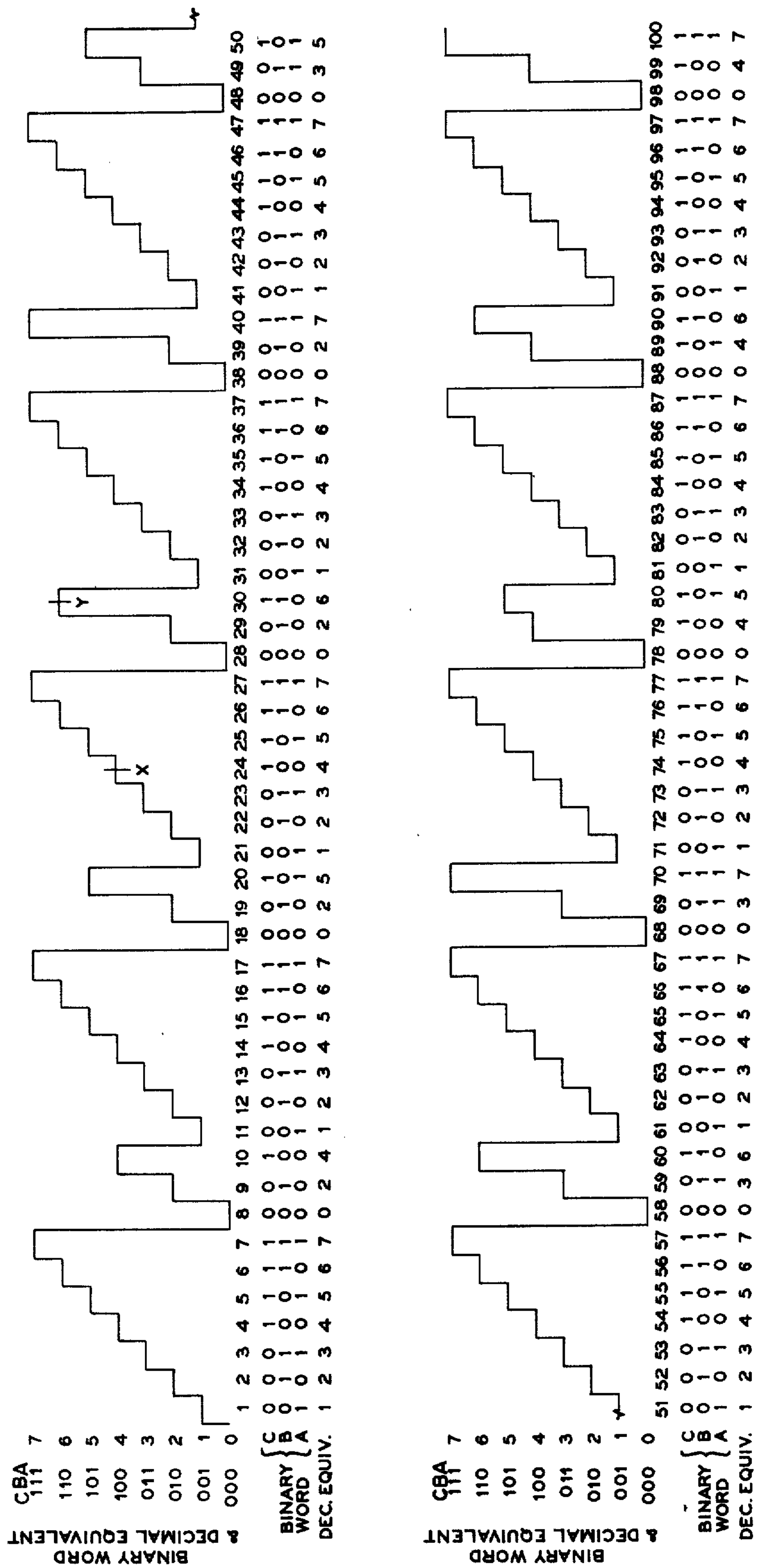
FIG. 1 is a schematic of the waveform of the present invention as a three bit system with a count capability of 100.
Figures 2, 3, 4:
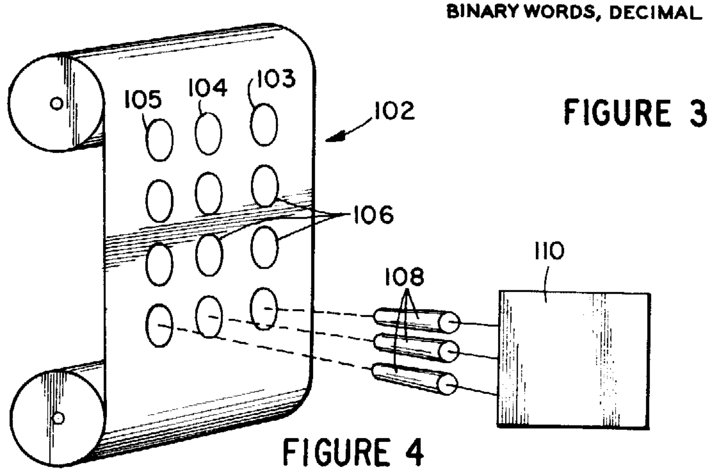
FIG. 2 is a table showing in the three center columns the eight binary numbers used, each containing only three bits, while the left hand column indicates the relative position in FIG. 3 and the right hand column indicates the decimal equivalent of the three bit data word appearing in the same row.
FIG. 3 is the equivalent of FIG. 1, showing in tabular form the binary concatenated coding system used with a count capability of one to one hundred. The top row of FIG. 3, labeled "Position," corresponds to the column of eight positions in FIG. 2, and has two additional columns for the 9's and 10's. The left hand column of FIG. 3 indicates the decimal group of 10 in which the numbers in the table lie, while the right hand column indicates the decade by number: that is, the decade labeled 0 indicates that all the entries in the row to the left of that of the 0 decade lie between 1 and 10, the decade labeled 1 indicates that the numbers in the row to the left of the 1 decade lie between 11 and 20, etc. It is also to be understood that each of the numbers represented within the table of FIG. 3 is a decimal number finding its binary equivalent in the three center columns of FIG. 2.
FIG. 4 shows a typical embodiment of the invention.

FIG. 1 shows the graphical or "waveform" equivalent of the 100 counts set forth in tabular form in FIG. 3. It will be apparent that the first seven digits of any decade are indistinguishable in themselves from the first seven digits of any other decade in the system, but this is precisely analogous to such common instruments as the carpenter's rule or meter stick previously discussed. It will also be noted that every decimal number ending with the digit 8 is represented as a zero, that every decimal number ending in a 9 is either a 2, 3, or 4, and that the 10's are represented by 4, 5, 6 or 7. In making use of this scale or code, the user who for instance finds himself reading at the point labeled X in the figure will know immediately only that the quantity involved ends in a 4. He then scans to the left and reads the 9's and 10's figures just before the decade in which his X lies, and will read these as 25, which he translates mentally or by encoder to apprise himself that the immediately preceding decade ended with a 20. Thus he knows that the number he is reading in the decimal system is 20 + 4, or 24. Should the number he happens to have to read fall at point Y, his immediate knowledge is only that the coded number ends with the digit 6. To determine the balance of the number, he need scan only to the left one unit, where he reads a 2. Knowing from his code that 6 follows 2 only in the 9's and 10's columns, he is immediately able to determine that his number is 30 because 6 follows 2 only for 30.

At the left of FIG. 1 there is a set of numbers rising from 0 to 7 to indicate the decimal number of the particular step, and to the left of such numbers is the binary coding for that particular step. Similarly, below the figure there is first listed in serial number order all of the decimal numbers in the total of 100, below it the binary coding corresponding to the actual size of the step, and finally, at the very bottom, the decimal equivalent of the binary date. It will be seen that all of these correspond to the like data expressed in FIGS. 2 and 3.

Turning to FIG. 2, it will be seen that the three center columns are labeled A, B and C to indicate the binary digits in ascending order: $A = 1 = 1\times2^0$, $B = 2 = 1\times2^1$, and $C = 4 = 1\times2^2$. The right hand column, labeled A+B+C, indicates the decimal equivalent of the three center columns, e.g., in position 3, A+B+C = 1+2+0+3. Since there are only eight possible permutations of zero and one taken three at a time, and a zero position must be included, the number of possible unique data words becomes exhausted at position 7, where A+B+C = 1+2+4=7. In the preferred embodiment of the BCC system, each position 8 is represented by a zero, or A+B+C = 0+0+0=0.

Turning now to FIG. 3, we see that the top row, labeled Position, identifies eight columns which correspond to the eight positions or rows of FIG. 2, with three additional columns added. The first two of these indicate the 9's and 10's of the decimal system and the last column indicates how the 9's and 10's entries of any row determines the decade of the decimal system. The left hand column also indicates decades, in particular indicating the total ten digits lying in that decade.

By way of amplifying on the discussion above concerning FIG. 1, it will be noted that the combination of a 9 and 10 for any particular row is uniquely different from that for any other row, and thus the user of the code knows that 24 indicates the zero decade, or 1–10, the decade 25 read in the second row under the 9's and 10's indicates the first decade, or that including the decimal number 11 to 20, etc. It will be noted first that there is no digit in either of the 9's and 10's column higher than 7, which again means that it can be expressed in binary language with only three bits or digits. It will be also noted that the selected 9's and 10's have been chosen to fit a formula which defines the decade, specifically that three (0's) + (10's) − 10 = the number of the decade.

A possible variant of the coding system thus far described is identical to that of FIG. 3 except in the 9's and 10's columns. In the modification the first 9 and 10 combination is 0 and 0, followed by 0 and 1 for 1, 0 and 2 for 2, 0 and 3 for 3, and so on up through 0 and 7 for 7. To avoid going to an 8 or higher, which would be binary translatable only by a four bit data word, we start over again with 1 and 0 for 8, 1 and 1 for 9, etc., and by the this time have completed the 99th and 100th decimal numbers. It will be apparent that this process could be repeated through 077 to cover the decimal numbers through 640, and that if we started over again, this time using the 8 's column, we could use 100 for the 65th decade, 101 for the 66th, etc., and would be able to cover several thousands of continuous numbers of the decimal system with only a three bit binary code. This system may require somewhat more scanning to determine the exact decimal equivalent for any one reading, as for instance that corresponding to 9 in the decimal systems. However, for every decimal number there is something unique about its position, and for 9 we find that it is the only number coded as zero which has a zero both to its left and to its right, uniquely defining it by scanning only the adjacent number on each side. For any decimal number lying between one and seven, we need scan only the last two columns of the previous decade; for instance, for the decimal number 86 our immediate information is only that the number has 6 as its last digit, but if we scan the last two columns of the previous decade and find that they are 07, we know that we have passed the number 80 and hence our number must be 86. When the code is extended into several thousands, it may be necessary to scan all three of the last columns of the prior decade to determine the value of the number we are identifying.

Another variant or extension of the binary concatenated coding system of the present invention is extended to cover all numbers from 1 to 10,000 of the decimal system. This is a four-bit system, and uses all numbers from 0 through 9. However, it is like the systems previously described in that all decimal numbers whose last digits lie between 1 and 7 are expressed in the binary equivalents of those numbers, but departs from the prior systems in that the 8's, 9's and 10's positions are uniquely coded according to the present invention. Thus we use for these last three positions 000 to identify the zero decade, 100 to identify decade 1, 200 to identify decade 2, etc., through 900 for decade 9. Thereafter the code numbers for the last three positions may be readily determined by imagining the column headings "Digit and Decade" for the 8's, "Digit and Century" for the 9's, and "Digit and Millenium" for the 10's position. Thus the decimal number 118, 119, and 120, all lying in decade 1 of century 1 of millenium zero, would be expressed as 110; decimal numbers 1008, 1009 and 1010 would be coded as 001; and decimal numbers 5998, 5999 and 6000 would be coded as 995, etc. It will be evident that scanning these last three positions instantly identifies the decade, century and millenium to which the particular number belongs, and that no encoder need be employed.

FIG. 4 shows a binary concatenated measuring system according to the present invention. An elongated record such as a linearly transportable tape 102 has three parallel columns 103, 104, and 105 of coded data entries 106, an entry in each column being aligned with an entry in each of the other two columns so as to form a three-bit data word. Each of the data entries 106 is expressed as a binary digit (0 or 1) or equivalent so that the sum of any three aligned entries (data word) expresses a physical measurement according to the binary concatenated code of this invention. In this code the first seven numbers (i.e., 1, 2, 3, 4, 5, 6, 7) of any decimal system decade (i.e., 10's, 20's, 30's, etc.) correspond to the first seven digital numbers (i.e., 1, 2, 3, 4, 5, 6, 7) of the binary numbering system). The eighth number of any decade is a 0 (i.e., the 3-bit data word for any number ending in eight is 000). The ninth and 10th places in any decade are represented by data words which are chosen ones of said first seven digital data of the binary numbering system. For example, the number 19 might be represented by data word 010 (digital 2) and the number 20 might be represented by data word 101 (digital 5). These data words must be so selected that they may be easily interpreted to indicate the decade in which they lie. Sensing means 108 are positioned adjacent to the tape 102 to scan successive sets of aligned entries (data words). Readout means 110 are connected to the sensing means 108 to display or record the readout of the individual data words or convert them to the decimal system as desired.

It will be appreciated that in this apparatus, each of the data entries 106 may be represented by either an opaque area or a transparent area corresponding to binary 0 and 1.

APPLICATIONS

A. Measurement of Displacement

As an example of a use of the present invention to measure displacement, a mechanical device may be incorporated with a 100-gallon tank either simply to monitor the amount of fluid in the tank or to both monitor and record the net contents therein at regular intervals, the latter providing data for determining and recording the rate of consumption, as well. While such device may take several different forms, a simple type would include a fixed vertical measuring stick and a floating member containing a light source and three photoelectric cells, the latter being connected electrically or electronically to a read-out device. The vertical measuring stick would be correlated with the tank geometry so that 100 lines or other indicia would appear on the stick, spaced vertically from one another to indicate 1-gallon increments. Also displayed on the stick to one side or the other of the 100 lines would be three columns of symbols, each containing 100 symbols; these would be displayed in 100 rows of three symbols each, one for each line of the measuring stick.

Such 100 rows of symbols would correspond to the 100 binary words displayed at the bottom of FIG. 1, but in place of the binary digits on opaque area would represent each 0 and a transparent area would take the place of each 1. If the readings desired are of gallons remaining in the tank, the rows of symbols would be arranged in descending order from the top of the stick to the bottom, so that the row of symbols displayed with the uppermost line would read as three transparent areas while the bottommost row would appear as one transparent area followed by two opaque areas.

The float member may be mechanically constrained to float closely adjacent the measuring stick, oriented so that the light source directs its output onto the measuring stick and the light passing through any transparent area falls on a photoelectric cell, one of which floats vertically in association with a particular column.

The readout part of the circuitry may consist of three parallel lines each connected to one of the photocells and each containing a voltage source and a resistor of a particular value so that, for example, a current of either 0 or 4 milliamperes (ma.) will flow in one line, 0 or 2 ma. in the second, and zero or 1 ma. in the third, the 0 corresponding, of course, to a condition of an opaque area of the measuring stick blocking or screening the associated photocell from receiving any light. The balance of the readout circuit may take various forms, e.g., each of the lines may be independently connected to a buzzer, lamp or other element indicating either an off or an on condition. Alternately, the three branch lines may be connected together through a single line fed through an ammeter to provide an integrated or A+B+C reading, corresponding to the decimal equivalents appearing as the bottom line of FIG. 1. In either case the integrated output may also be fed through a recording chart device to obtain a permanent record of consumption. If the rate of use were linear and constant, the generated record would reproduce the waveform of FIG. 1, or a mirror image of it.

It should be pointed out that the BCC system as thus applied is not limited to the type of history in which a full tank is steadily drained to a state of emptiness, but will monitor and record both increments or decrements, and will read the net contents if fluid is being drained from and added to the tank simultaneously. This is possible because, as will be seen in FIG. 1, a net increase in the gallons remaining always causes an increase in read-out, with the one easily recognized exception for the 8's position, and a net decrease always causes a net decrease in read-out, with the same exception. The drop to zero corresponding to decimal numbers ending in an 8 creates no real problem, as the user will readily recognize an eight as such and will identify it as an increment if the previous reading were a seven — or as a decrement if the previous reading were anything but a seven.

It will be apparent the BCC system is similarly applicable to many other types of measurements, e.g., body circumference measurements at various points, using a tape similar to a dressmaker's tape but having the markings and opaque-transparent areas as discussed above, together with a miniaturized light source and photocells, the same being particularly useful when such measurements may be expected to undergo some continuous change, for instance in a state of relative weightlessness in outer space, when acted on by high pressures under water, or when placed under some other stress in biomedical observations. Other measurements adaptable to the BCC system are time code transmissions, rates of change, and intensities of electromagnetic fields, to mention but a few.

B. Counting System Application

As an example showing the advantages of the BCC system of the present invention, take a motion picture film made up of many frames, or individual pictures. Advantage may be taken of an already existing visual "grey" code to assign and number the frames in serial number order using the BCC system. In a grey code there are spots of varying opaqueness, and for use with the present invention the grey code may be limited to eight levels of opaqueness, starting with a very light grey corresponding to the number 1 of the decimal system, a slightly darker grey for numeral 2, etc., up to dead black for numeral 7 and followed by a completely transparent spot for numeral 8. For the 9's and 10's, the code of the present invention may be used, e.g., for 9 grey level 2, for 10 grey level 4, for 19 grey level 2 and for 20 grey level 5, etc., as described above and shown in the drawing.

It will be evident that a single spot per frame, placed in a corner or on a side track, makes it possible to incribe 100 frames. Since the number of frames per film is generally much greater than 100, two more spots may be added to each frame, one indicating 100's and the other indicating 10,000's, making a numbering capacity of 1 million. Thus if the grey code reading were to be 777 for a particular frame, the reader seeking to identify the number would consider first the left hand digit and refer back to the closest frame showing a different reading for the left hand frame. If this happened to be a 6, he would know from the code that it is necessary to look further at past frames to determine the numbers in the prior 9's and 10's position; if these two numbers (as translated from grey to decimal) were 4 and 5, the reader would know that the 10,000's part of his number is $87 \times 10,000 = 870,000$. He would follow the same procedure for the center digit, and might find the nearest preceding different center dight to be 4; this would tell him that another part of his number is $10 \times 100 = 1000$. Finally, he would consider the right hand digit, and the code of FIG. 2 might tell him that the balance of his number is 40. Putting the three parts together, he would arrive at serial number 871,040.

Of course, just as there are devices available to mark the spots on the film and a device known as a "spot dosimeter" to read the spots and translate the same into decimal system numbers, so are there available devices for translating the grey level numbers into either decimal numbers or binary language, and recording the same on a chart or in a computer memory bank. It will be apparent that the serial numbering can be extended by increasing the number of spots indefinitely, a fourth spot enabling a count capability of $10^8$, a fifth spot $10^{10}$, etc. The same system may also be used for dating each frame, requiring only three spots according to a system where 101372 represents Oct. 13, 1972. In addition, the hour, minute and second may be recorded by a three spot system wherein, for instance, 232535 signifies 11:25 o'clock and 35 seconds P.M.

C. Recording Applications

Recording applications have already been mentioned above, in connection with measuring and counting. By way of amplification, it might be mentioned that in the above example the readings of the contents of the 100-gallon tank during a period of consumption may be recorded on a tape rather than a chart, and that either the binary notation or decimal equivalents of the present coding system may be employed. If the binary notation is used, the tape readings may be stored in a computer memory bank for later retrieval.

What is claimed is:

1. A binary concatenated measuring system comprising:

1. an elongated record such as a linearly transportable tape having three parallel rows or columns of coded data entries, an entry in each row or column being aligned with an entry in each of the other two rows or columns, each said entry being expressed as a binary digit or equivalent so that the sum of any three aligned entries expresses a physical measurement according to a binary concatenated code in which the first seven numbers of any decimal system decade correspond to the first seven digital data of the binary numbering system, the eighth such number of any such decade is a zero, and the ninth and tenth such numbers are chosen ones of said first seven digital data of the binary numbering system so selected that they may be interpreted by machine operation to indicate the decade in which they lie;
2. sensing means adjacent said tape to scan successive sets of aligned entries; and
3. readout means connected to said sensing means to display or record the readout thereof.

2. The measuring system of claim 1 in which each said entry is either an opaque area or a transparent area.

* * * * *